(12) United States Patent
Yamamoto

(10) Patent No.: US 6,795,128 B2
(45) Date of Patent: Sep. 21, 2004

(54) TELEVISION TUNER CAPABLE OF RECEIVING FM BROADCAST

(75) Inventor: Masaki Yamamoto, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 502 days.

(21) Appl. No.: 09/899,710

(22) Filed: Jul. 5, 2001

(65) Prior Publication Data

US 2002/0003585 A1 Jan. 10, 2002

(30) Foreign Application Priority Data

Jul. 7, 2000 (JP) ........................................ 2000-211990

(51) Int. Cl.⁷ ................................................ H04N 5/46
(52) U.S. Cl. ....................................... 348/729; 348/738
(58) Field of Search ................................ 348/729, 731, 348/725, 553, 738, 737; 455/188.1, 191.1, 191.2; 334/1, 47, 52

(56) References Cited

U.S. PATENT DOCUMENTS

| | | | | |
|---|---|---|---|---|
| 4,939,789 A | * | 7/1990 | Sakashita et al. | 455/260 |
| 5,068,918 A | * | 11/1991 | Verheijen et al. | 455/142 |
| 5,148,280 A | * | 9/1992 | Wignot et al. | 348/729 |
| 5,710,993 A | * | 1/1998 | Brekelmans | 455/188.1 |
| 5,758,276 A | * | 5/1998 | Shirakawa et al. | 455/314 |
| 6,125,269 A | * | 9/2000 | Brekelmans | 455/180.1 |
| 6,211,925 B1 | * | 4/2001 | Kikuchi | 348/729 |
| 6,342,928 B1 | * | 1/2002 | Ohira | 348/729 |
| 6,445,425 B1 | * | 9/2002 | Limberg | 348/731 |
| 6,483,552 B1 | * | 11/2002 | Yamamoto | 348/729 |

FOREIGN PATENT DOCUMENTS

JP    Hei 7-162771    6/1995

* cited by examiner

*Primary Examiner*—Victor R. Kostak
(74) *Attorney, Agent, or Firm*—Brinks Hofer Gilson & Lione

(57) ABSTRACT

There is provided a television tuner which is small and inexpensive, so that although a television signal and an FM broadcast signal have different electric field strengths in band and signal, one circuit can receive both the television signal and the FM broadcast signal. A television signal is frequency-converted to the intermediate-frequency band of a television. An FM broadcast signal is frequency-converted to a voice intermediate frequency in the intermediate-frequency band. A first parallel tuned circuit and a second parallel tuned circuit are connected in parallel with each other in an intermediate-frequency tuned circuit. When the television signal is received, the television signal is tuned to a broad band by only the first parallel tuned circuit. When the FM broadcast signal is received, the FM broadcast signal is tuned to a narrow band by the first parallel tuned circuit and the second parallel tuned circuit.

12 Claims, 6 Drawing Sheets

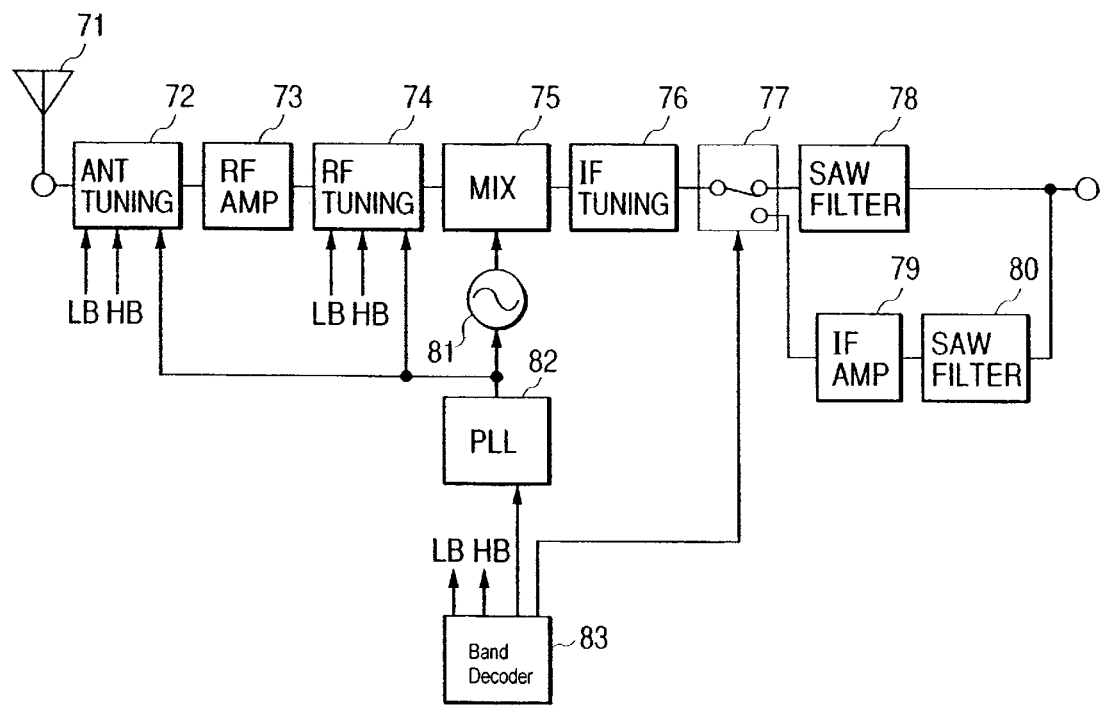

TELEVISION TUNER CAPABLE OF RECEIVING FM BROADCAST

BACKGROUND OF THE INVENTION

1. Field of the Invention

The present invention relates to a television tuner capable of receiving a television signal as well as an FM broadcast signal.

2. Description of the Prior Art

A television signal and an FM broadcast signal have different bandwidths. The television signal has a bandwidth of 6 MHz, and the FM broadcast signal has a bandwidth of 200 kHz. In addition, the television signal and the FM broadcast signal have different reception levels. The television signal has a reception level about 6 dB higher than that of the FM broadcast signal.

Conventionally, when a television signal and an FM broadcast signal are received by one television tuner, an SAW filter for a television signal and an SAW filter for an FM broadcast signal are provided in the intermediate-frequency circuit of a television tuner. When a television signal is received, the SAW filter for receiving a television signal eliminates an interference wave. When an FM broadcast signal is received, the SAW filter for receiving an FM broadcast signal eliminates an interference wave.

The construction of a conventional television tuner will be described in accordance with FIG. 8. In FIG. 8, a television signal or an FM broadcast signal received by an antenna 71 is tuned by an antenna tuned circuit 72, and then, is amplified by a high-frequency amplifier 73 to be tuned by a high-frequency tuned circuit 74. The antenna tuned circuit 72 and the high-frequency tuned circuit 74 have a varactor diode, not shown, respectively. An oscillation frequency control voltage is applied from a PLL circuit 82 described later to the cathode of the respective varactor diodes, so that the tuning frequency is controlled to be a frequency to be received.

A mixer 75 is fed the television signal or the FM broadcast signal outputted from the high-frequency tuned circuit 74, and is fed a local oscillation signal from a local oscillator 81. The local oscillator 81 is controlled by the oscillation frequency control voltage inputted from the PLL circuit 82 so as to output a local oscillation signal of the center frequency of the television signal to be received or of a frequency about 44 MHz which is higher than the FM broadcast signal. Thus, the mixer 75 frequency-converts the television signal to the intermediate-frequency band having a center frequency of 44 MHz, and frequency-converts the FM broadcast signal to 44 MHz. The oscillation frequency control voltage outputted from the PLL circuit 82 is applied to the antenna tuned circuit 72 and the high-frequency tuned circuit 74, as described above.

The television signal or the FM broadcast signal frequency-converted by the mixer 75 is tuned by a intermediate-frequency tuned circuit 76 to be inputted to a change-over switch 77. The change-over switch is controlled by a band decoder 83. When the television signal is received, the change-over switch 77 connects the intermediate-frequency tuned circuit 76 and an SAW filter for a television signal 78, and the television signal passes through the SAW filter for a television signal 78. The bandwidth of the SAW filter for a television signal 78 is 6 MHz. On the other hand, when the FM broadcast signal is received, the change-over switch 77 connects the intermediate-frequency tuned circuit 76 with an intermediate-frequency amplifier 79, and the FM broadcast signal is amplified by the intermediate-frequency amplifier 79 to eliminate a difference in levels of the television signal and the FM broadcast signal. Then, the FM broadcast signal passes through an SAW filter for an FM broadcast signal 80. The bandwidth of the SAW filter for an FM broadcast signal is 1.5 MHz.

Such a conventional television tuner must be provided with SAW filters having different bands separately for a television signal and an FM broadcast signal in order to receive the television signal and the FM broadcast signal. This prevents the television tuner from being made smaller and inexpensive.

SUMMARY OF THE INVENTION

Accordingly, an object of the present invention is to provide a television tuner which reduces the number of parts such as SAW filter, can be made smaller, and is inexpensive.

To solve the foregoing problems, a television tuner of the present invention comprises a mixer to be fed a television signal or an FM broadcast signal for frequency-converting the television signal to the intermediate-frequency band of a television, and frequency-converting the FM broadcast signal to a voice intermediate frequency in the intermediate-frequency band, and an intermediate-frequency tuned circuit provided at a later stage than the mixer, wherein the intermediate-frequency tuned circuit comprises a first parallel tuned circuit tuned to a frequency substantially in the center of the intermediate-frequency band, a second parallel tuned circuit tuned to a frequency lower than the voice intermediate frequency, and switch means connected in series with the second parallel tuned circuit, a signal of the intermediate-frequency band and a signal of the voice intermediate-frequency band are applied to both ends of the first parallel tuned circuit and both ends of a series circuit comprising the second parallel tuned circuit and the switch means, when the television signal is received, the switch means is brought into an off state, when the FM broadcast signal is received, the switch means is brought into an on state, so that a parallel circuit comprising the first tuned circuit and the second tuned circuit is tuned to the voice intermediate frequency. The switch means is switched on or off to change the tuning frequency and the bandwidth of the intermediate-frequency tuned circuit.

A television tuner of the present invention comprises a mixer to be fed a television signal or an FM broadcast signal for frequency-converting the television signal to the intermediate-frequency band of a television, and frequency-converting the FM broadcast signal to a voice intermediate frequency in the intermediate-frequency band, and an intermediate-frequency tuned circuit provided at a later stage than the mixer, wherein the intermediate-frequency tuned circuit comprises a first parallel tuned circuit, a second parallel tuned circuit, and a first varactor diode connected in series with the second parallel tuned circuit, the parallel tuning frequency of any one of the first parallel tuned circuit and the second parallel tuned circuit is set to be higher than the frequency in the center of the intermediate-frequency band, and the parallel tuning frequency of the other tuned circuit is set to be lower than the voice intermediate frequency, the signal of the intermediate-frequency band and the signal of the voice intermediate-frequency band are applied to both ends of the first parallel tuned circuit and both ends of a series circuit comprising the second parallel tuned circuit and the first varactor diode, when the television signal is received, a reverse bias voltage is applied to the first varactor diode, so that the second parallel tuned circuit and the first varactor diode are series-tuned to the frequency of the intermediate-frequency band corresponding to the image carrier of a higher side television channel adjacent to a television channel to be received, and a parallel circuit of the second parallel tuned circuit and the first varactor diode connected in series, and the first parallel tuned circuit is tuned to the intermediate-frequency band, when the FM broadcast signal is received, the first varactor diode is brought into a conductive state, so that a parallel circuit comprising the first parallel tuned circuit and the second parallel tuned circuit is tuned to the voice intermediate-frequency. The bias voltage of the first varactor diode is switched to change the tuning frequency and the bandwidth of the intermediate-frequency tuned circuit.

The television tuner of the present invention comprises an intermediate-frequency amplifier provided at a later stage than the mixer, and a series tuned circuit connected between the output end and the ground of the intermediate-frequency amplifier, wherein the series tuned circuit has a midpoint as an output end, the tuning frequency of the series tuned circuit can be changed, when the television signal is received, the tuning frequency of the series tuned circuit is outside the intermediate-frequency band, when the FM broadcast signal is received, the tuning frequency of the series tuned circuit is tuned to the voice intermediate frequency. The levels of the television signal and the FM broadcast signal are adjusted.

In the television tuner of the present invention, the first parallel tuned circuit has a first inductance element and a first capacitor connected in parallel with each other, the second parallel tuned circuit has a second inductance element and a second capacitor connected in parallel with each other, the series tuned circuit has a second varactor diode, a third inductance element, and a third capacitor connected in series with each other, and a fourth capacitor connected in parallel with the third capacitor through second switch means, the series tuned circuit has a midpoint as an output end, when the television signal is received, a reverse bias voltage is applied to the first varactor diode and the second varactor diode, and the second switch means is brought into an off state, when the FM broadcast signal is received, a forward bias is applied to the first varactor diode and the second varactor diode, and the second switch means is brought into an on state.

In the television tuner of the present invention, the intermediate-frequency tuned circuit is provided with a trap circuit, the trap circuit has a fourth inductance element and a third varactor diode connected in parallel with each other, when the television signal is received, a reverse bias voltage is applied to the third varactor diode, so that the trap circuit attenuates the signal of the frequency of the intermediate-frequency band corresponding to the voice carrier of a lower side television channel adjacent to a television channel to be received, when the FM broadcast signal is received, the reverse bias voltage applied to the third varactor diode is lowered than when the television signal is received, and the trap frequency is a frequency between the image carrier and the voice carrier of the intermediate-frequency band. The television signal and the FM broadcast signal have a suitable band characteristic, respectively.

BRIEF DESCRIPTION OF THE DRAWINGS

FIG. 8 is a block diagram of a conventional television tuner.

PREFERRED EMBODIMENTS OF THE INVENTION

Figure 1:
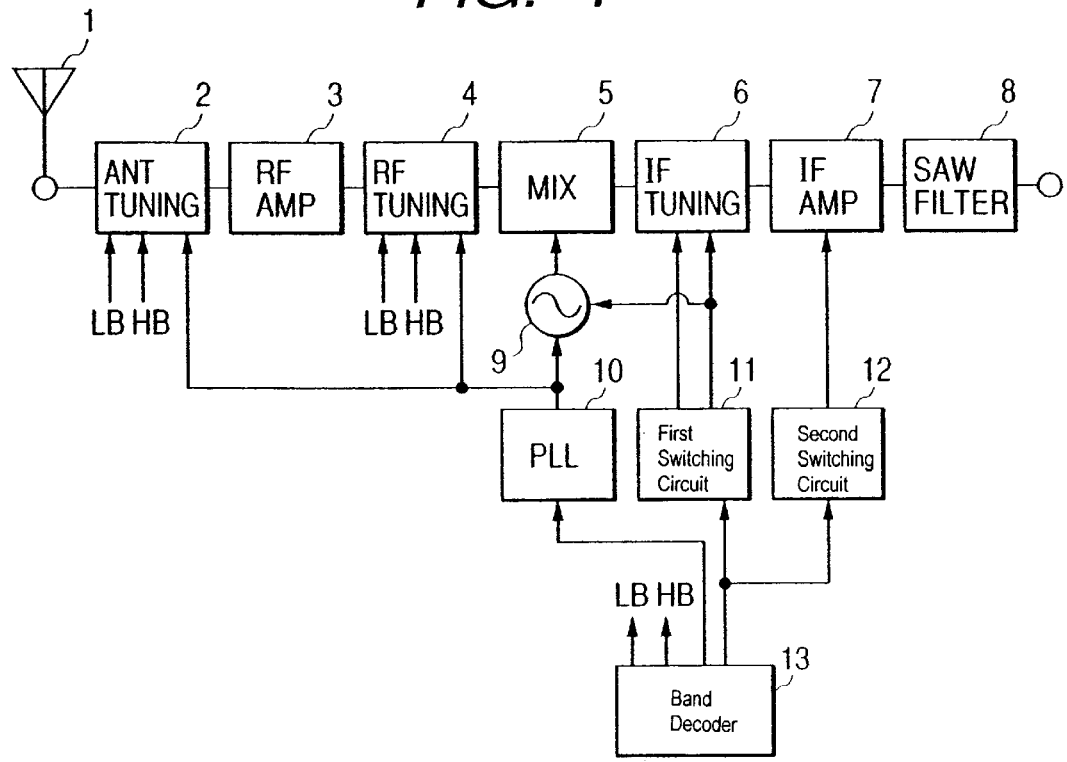
FIG. 1 is a block diagram of a television tuner of the present invention.
Figure 2:
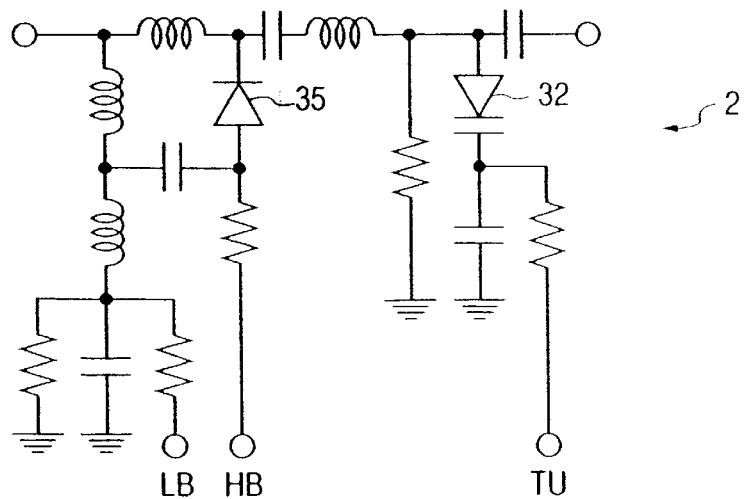
FIG. 2 is a circuit diagram showing one embodiment of an antenna tuned circuit for use in the television tuner of the present invention.
Figure 3:
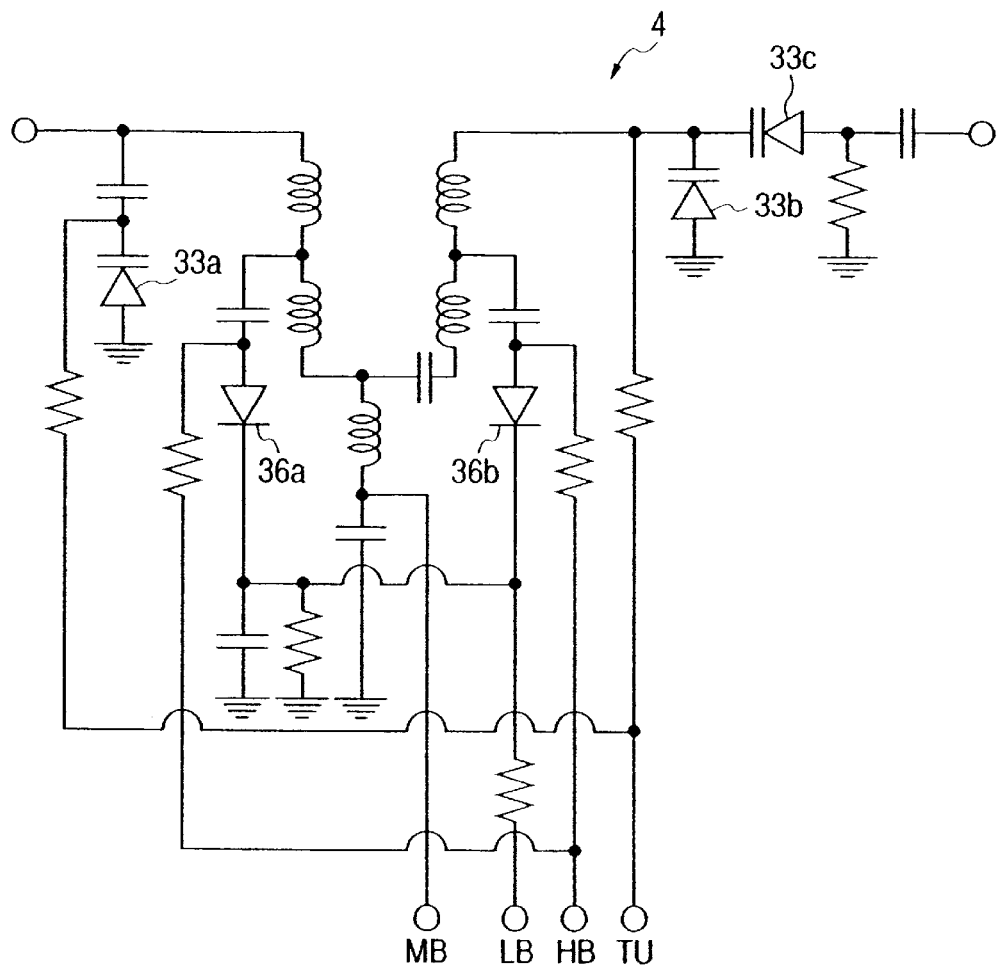
FIG. 3 is a circuit diagram showing one embodiment of a high-frequency tuned circuit for use in the television tuner of the present invention.
Figure 4:
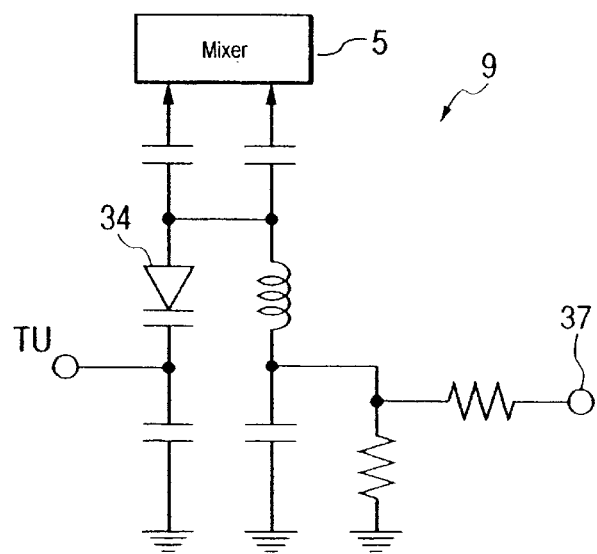
FIG. 4 is a circuit diagram showing one embodiment of a local oscillator for use in the television tuner of the present invention.
Figure 5:
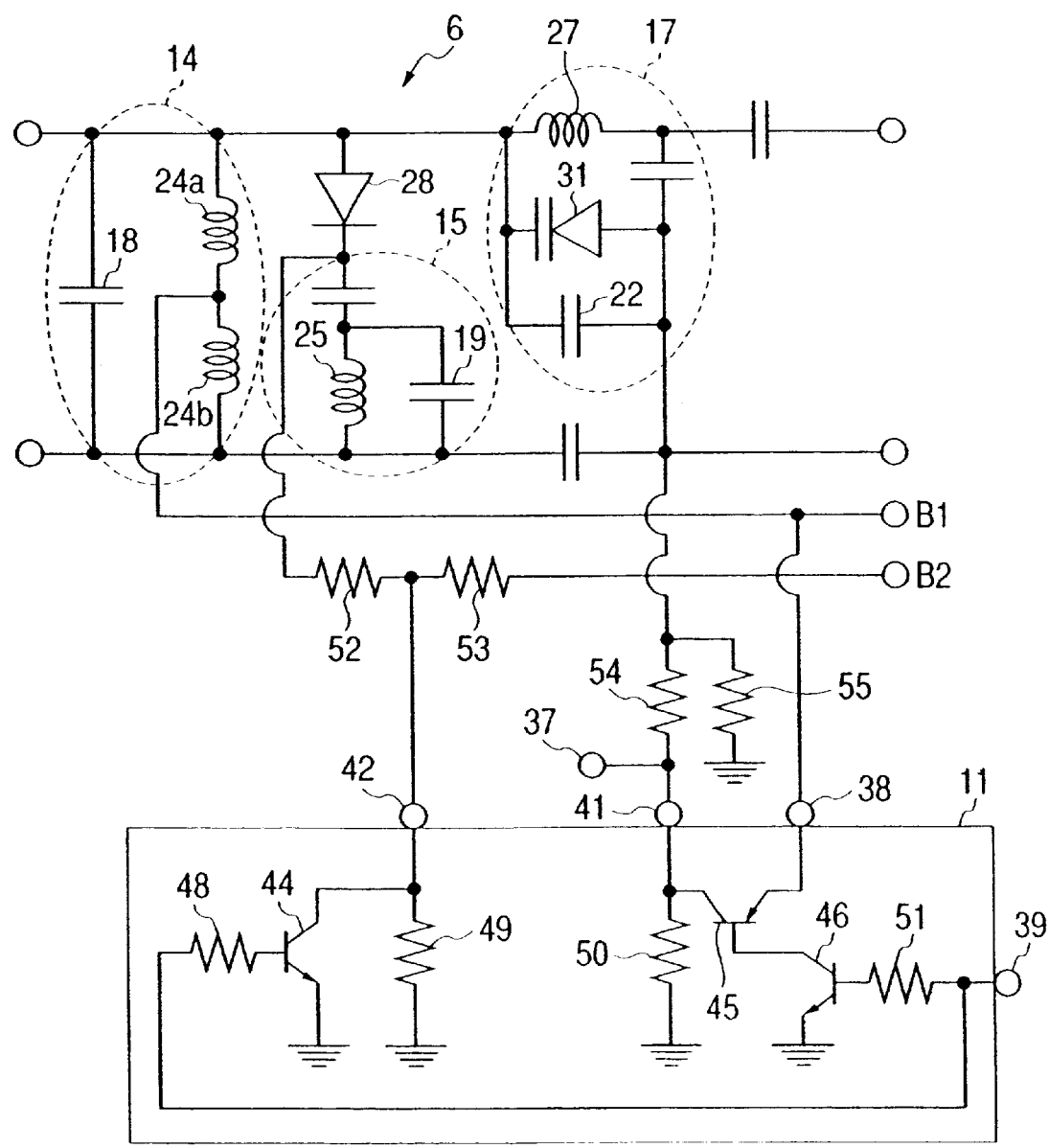
FIG. 5 is a circuit diagram showing one embodiment of an intermediate-frequency tuned circuit and a first switching circuit for use in the television tuner of the present invention.
Figure 6:
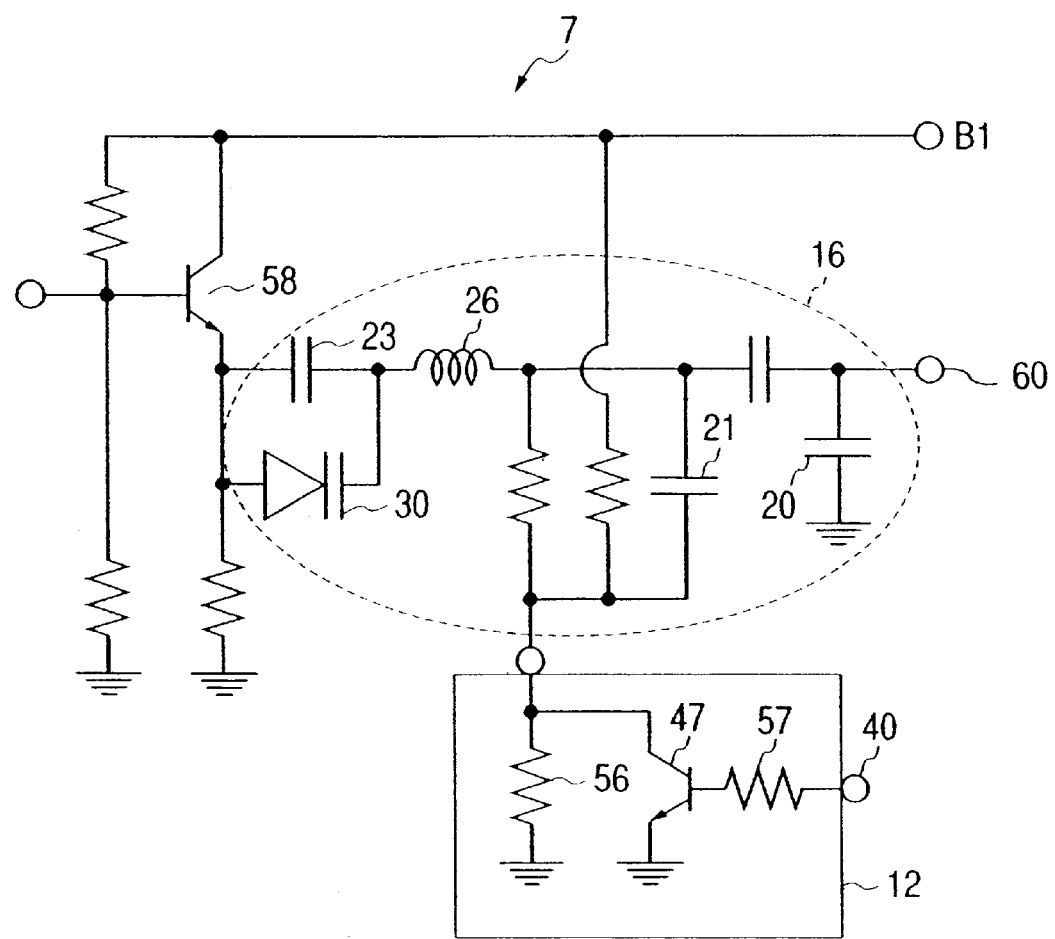
FIG. 6 is a circuit diagram showing one embodiment of an intermediate-frequency amplifier circuit for use in the television tuner of the present invention.
Figure 7:
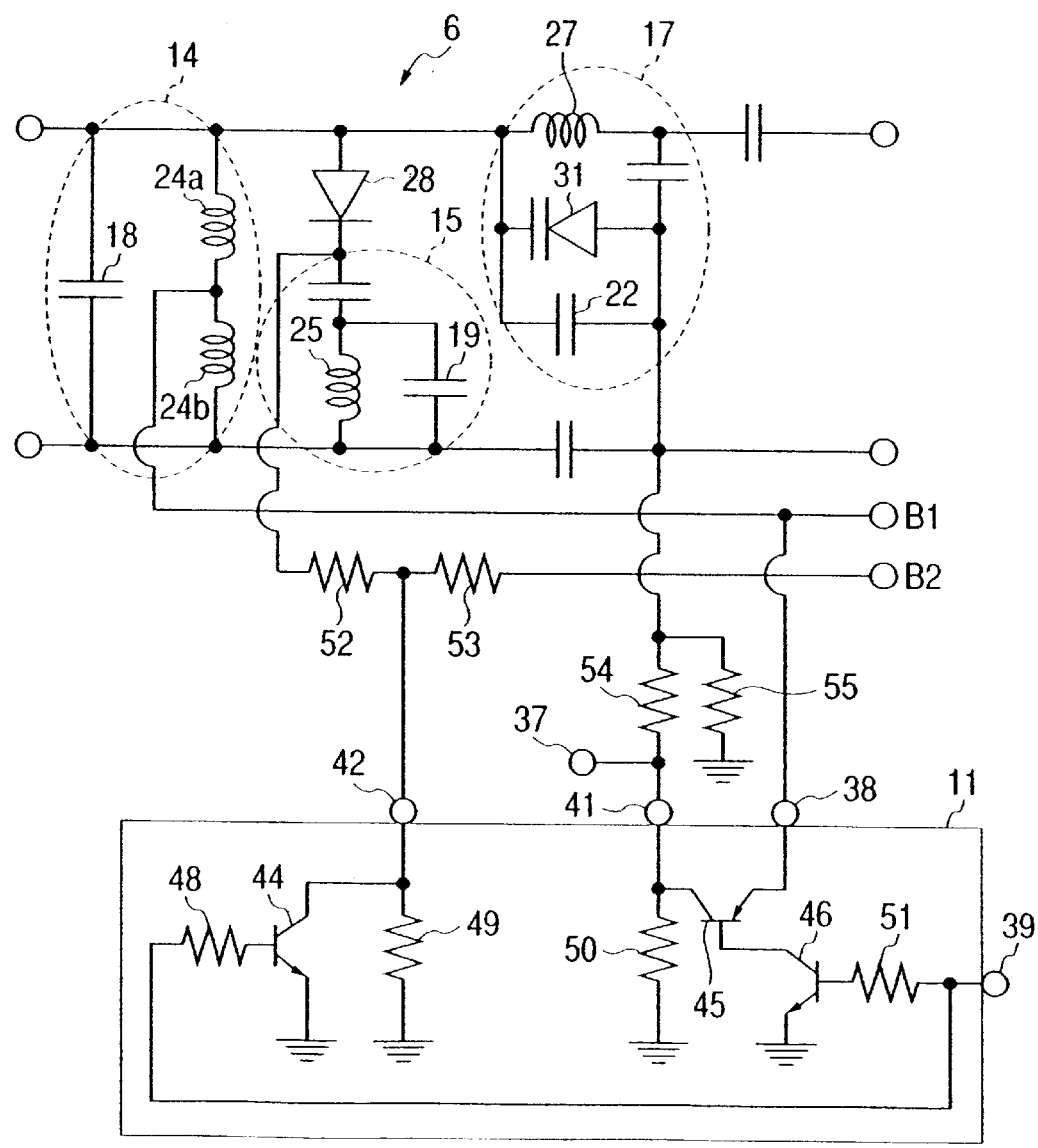
FIG. 7 is a circuit diagram showing another embodiment of an intermediate-frequency tuned circuit for use in the television tuner of the present invention.

The television tuner of the present invention will be described in accordance with FIGS. 1 to 7. FIG. 1 shows a block diagram of the television tuner of the present invention. FIG. 2 shows one embodiment of an antenna tuned circuit 2 shown in FIG. 1. FIG. 3 shows one embodiment of a high-frequency tuned circuit 4 shown in FIG. 1. FIG. 4 shows one embodiment of a local oscillator 9 shown in FIG. 1. FIG. 5 shows one embodiment of an intermediate-frequency tuned circuit 6 and a first switching circuit 11 shown in FIG. 1. FIG. 6 shows one embodiment of an intermediate-frequency amplifier circuit 7 and a second switching circuit 12 shown in FIG. 1. FIG. 7 shows another embodiment of the intermediate-frequency tuned circuit 6 and the first switching circuit 11 shown in FIG. 1.

In FIG. 1, the television tuner is provided with an antenna tuned circuit 2, a high-frequency amplifier 3, a high-frequency tuned circuit 4, a mixer 5, an intermediate-frequency tuned circuit 6, an intermediate-frequency amplifier circuit 7, an SAW filter 8, a local oscillator 9, a PLL circuit 10, a first switching circuit 11, a second switching circuit 12, and a band decoder 13.

A television signal or an FM broadcast signal received by an antenna 1 is tuned by the antenna tuned circuit 2. As shown in FIG. 2, the antenna tuned circuit 2 has a fourth varactor diode 32, and the tuning frequency is changed by a reverse bias voltage applied from a terminal TU to the cathode of the fourth varactor diode 32. The bias voltage is the same voltage as an oscillation frequency control voltage described later outputted from the PLL circuit 10, and changes the capacitance of the fourth varactor diode 32 so that the tuning frequency of the antenna tuned circuit 2 corresponds with the frequency of a signal to be received. A terminal LB and a terminal HB are a terminal for switching between a low band and a high band of VHF, and are connected to the band decoder 13. When the VHF low band is received, the terminal LB has a voltage higher than that of the terminal HB, and a first switch diode 35 is brought into an off state. When the VHF highband is received, the terminal LB has a voltage lower than that of the terminal HB, and the first switch diode 35 is brought into an on state.

The television signal or the FM broadcast signal which has passed through the antenna tuned circuit 2 is amplified by the high-frequency amplifier 3, and then is tuned by the high-frequency tuned circuit 4. As shown in FIG. 3, the high-frequency tuned circuit 4 has fifth varactor diodes 33a to 33c, and the tuning frequency is changed by a reverse bias voltage applied from the terminal TU to the cathode of the fifth varactor diodes 33a to 33c. The bias voltage is the same voltage as an oscillation frequency control voltage outputted from the PLL circuit 10 described later, and changes the capacitance of the fifth varactor diodes 33a to 33c so that the tuning frequency of the high-frequency tuned circuit 4 corresponds with the frequency of a signal to be received. The terminal LB and the terminal HB are a terminal for switching between a low band and a high band of VHF, and are connected to the band decoder 13. When the VHF low band is received, the terminal LB has a voltage higher than that of the terminal HB, and the second switch diodes 36a, 36b are brought into an off state. When the VHF high band is received, the terminal LB has a voltage lower than that of the terminal HB, and the second switch diodes 36a, 36b are brought into an on state.

The television signal or the FM broadcast signal which has passed through the high-frequency tuned circuit 4 is inputted to the mixer 5 together with a local oscillation signal outputted from the local oscillator 9, and then, is frequency-converted by the mixer 5 to be outputted to the intermediate-frequency tuned circuit 6. As shown in FIG. 4, the local oscillator 9 has a sixth varactor diode 34, and the frequency of the local oscillation signal is changed by an oscillation frequency control voltage applied from the PLL circuit 10 through the terminal TU to the cathode of the sixth varactor diode 34. When the television signal is received, the local oscillator 9 outputs a local oscillation signal of a frequency of 44 MHz which is higher than the center frequency of the television signal received. On the other hand, when the FM broadcast signal is received, the local oscillator 9 outputs a local oscillation signal of a frequency of 41.25 MHz which is higher than the frequency of the FM broadcast signal received. The frequency bandwidth of the television signal is 6 MHz. The mixer 5 frequency-converts the television signal to an intermediate-frequency band in the range of 41 MHz to 47 MHz. The center frequency thereof is 44 MHz, the voice intermediate frequency is 41.25 MHz, and the image intermediate frequency is 45.75 MHz. On the other hand, the FM broadcast signal is frequency-converted to 41.25 MHz equal to the voice intermediate frequency of the television signal.

A terminal 37 of the local oscillator 9 is connected to a non-inverted output terminal 41 of the first switching circuit 11 described later (see FIG. 5). When the television signal is received, a voltage of 0V is applied from the terminal 37 to the anode of the sixth varactor diode 34. When the FM broadcast signal is received, a voltage of 2V is applied from the terminal 37 to the anode of the sixth varactor diode 34. The relation between the oscillation frequency control voltage outputted from the PLL circuit 10 and the frequency of the local oscillation signal outputted from the local oscillator 9 is changed at reception of the television signal and at reception of the FM broadcast signal. The oscillation frequency control voltage for the frequency of the local oscillation signal at reception of the FM broadcast signal is 2V higher than that at reception of the television signal. There is changed the relation between the voltage applied to the cathode of the fourth varactor diode 32 of the antenna tuned circuit 2 and the fifth varactor diodes 33a to 33c of the high-frequency tuned circuit 4, and the frequency of the local oscillation signal. For this reason, when the television signal is received, the tuning frequency of the antenna tuned circuit 2 and the high-frequency tuned circuit 4 is a frequency 44 MHz which is lower than the frequency of the local oscillation signal. When the FM broadcast signal is received, the tuning frequency of the antenna tuned circuit 2 and the high-frequency tuned circuit 4 is a frequency 41.25 MHz which is lower than the frequency of the local oscillation signal.

The television signal or the FM broadcast signal which has been frequency-converted by the mixer 5 is inputted to the intermediate-frequency tuned circuit 6. The intermediate-frequency tuned circuit 6 is a balance type circuit, and has a first parallel tuned circuit 4, a second parallel tuned circuit 15, switch means 28 consisting of a switch diode and connected in series with the second parallel tuned circuit 15, and a trap circuit 17. The television signal or the FM broadcast signal frequency-converted is applied to both ends of the first parallel tuned circuit 14 and both ends of a series tuned circuit consisting of the second parallel tuned circuit 15 and the switch means 28. The first parallel tuned circuit 14 has a first capacitor 18 and first inductance element 24a, 24b. The first parallel tuned circuit 14 is tuned at 44 MHz which is a frequency in the center of the intermediate-frequency band, and has a bandwidth of 6 MHz. The second parallel tuned circuit 15 has a second capacitor 19 and a second inductance element 25. The second parallel tuned circuit 15 is tuned at about 38 MHz which is lower than the voice intermediate frequency, and has a bandwidth of about 1.8 MHz. In the trap circuit 17, a fourth inductance element 27, a third varactor diode 31, and a fifth capacitor 22 are connected in parallel with each other, and are inserted into one of the balance lines.

The intermediate-frequency tuned circuit 6 is connected to the first switching circuit 11. The first switching circuit 11 has a power supply terminal 38, a band switch input terminal 39, a non-inverted output terminal 41, and an inverted output terminal 42. The first switching circuit 11 is an integrated circuit, and its equivalent circuit includes a first switch transistor 44, a second switch transistor 45, a third switch transistor 46, a first resistance 48, a second resistance 49, a third resistance 50, and a fourth resistance 51. The first switch transistor 44 is an NPN type transistor, and has an emitter grounded, a base connected through the first resistance 48 to the band switch input terminal 39, and a collector grounded through the second resistance 49 and connected to the inverted output terminal 42. The second switch transistor 45 is a PNP type transistor, and has a collector grounded through the third resistance 50 and connected to the non-inverted output terminal 41, an emitter connected to the power supply terminal 38, and a base connected to the collector of the third switch transistor 46. The third switch transistor 46 is an NPN type transistor, and has an emitter grounded, and a base connected through the fourth resistance 51 to the band switch input terminal 39. A first power supply voltage B1 of 5V is applied at the midpoint of the first inductance elements 24a, 24b, and is applied through the first inductance element 24a to the anode of the switch means 28 and the cathode of the third varactor diode 31. The first power supply voltage B1 is also applied to the power supply terminal 38 of the first switching circuit 11. The second power supply voltage B2 of 30V is shunted by the first switching circuit 11, and is connected to the cathode of the switch means 28.

When the television signal is received, a voltage of 0V is applied from the band decoder 13 to the band switch input terminal 39. Then, the first switch transistor 44 is turned off. The second power supply voltage B2 is divided by the second resistance 49 and a sixth resistance 53, so that the voltage of the inverted output terminal 42 is 10V and is inputted to the cathode of the switch means 28. The switch means 28 to which a reverse bias voltage is applied is brought into an off state. The intermediate-frequency tuned circuit 6 is parallel-tuned by only the first parallel tuned circuit 14. The tuning frequency is 44 MHz, and the bandwidth is 6 MHz.

When a voltage of 0V is applied from the band decoder 13 to the band switch input terminal 39, the third switch transistor 46 is turned off, and the second switch transistor 45 is turned off. The voltage of the non-inverted output terminal 41 is 0V, and the reverse bias voltage applied to the third varactor diode 31 is 5V, so that the capacitance value of the third varactor diode 31 is relatively low. In this state, the frequency of the signal attenuated by the trap circuit 17 is 47.25 MHz which is the frequency of the intermediate-frequency band corresponding to the voice carrier of a lower side television channel adjacent to a television channel received.

When the FM broadcast signal is received, a voltage of 5V is applied from the band decoder 13 to the band switch input terminal 39. Then, the first switch transistor 44 is turned on, so that the voltage of the inverted output terminal 42 is 0V and is inputted to the cathode of the switch means 28. The switch means 28 to which a forward bias voltage is applied is brought into an on state. The intermediate-frequency tuned circuit 6 is parallel-tuned by a parallel circuit consisting of the first parallel tuned circuit 14 and the second parallel tuned circuit 15. The tuning frequency is 41.25 MHz which is a frequency between the first parallel tuned circuit 14 and the second parallel tuned circuit 15. The bandwidth is about 1.5 MHz which is narrower than that of both the first parallel tuned circuit 14 and the second parallel tuned circuit 15.

When a voltage of 5V is applied from the band decoder 13 to the band switch input terminal 39, the third switch transistor 46 is turned on, and the second switch transistor 45 is turned on. The voltage of 5V is outputted from the non-inverted output terminal 41, and is divided by a seventh resistance 54 and an eighth resistance 55, so that a voltage of 4V is applied to the anode of the third varactor diode 31. The reverse bias voltage applied to the third varactor diode 31 is 1V, and the capacitance value of the third varactor diode 31 is relatively high. In this state, the frequency of the signal attenuated by the trap circuit 17 is 43 MHz which is slightly higher than the voice carrier of the intermediate frequency.

The television signal or the FM broadcast signal which has been tuned by the intermediate-frequency tuned circuit 6 is inputted to the intermediate-frequency amplifier circuit 7. As shown in FIG. 6, the intermediate-frequency amplifier circuit 7 has an amplifier 58 consisting of an NPN type transistor, a second varactor diode 30 and a sixth capacitor 23 having one end connected to the output end of the amplifier 58, a third inductance element 26 having one end connected to the other end of the second varactor diode 30 and the sixth capacitor 23, a fourth capacitor 21 connected the other end of the third inductance element 26 and shunted by the ground through the second switching circuit 12, and a third capacitor 20 provided between the other end of the third inductance element 26 and the ground. The voltage at both ends of the third capacitor 20 is outputted from an output end 60. The output terminal 43 of the second switching circuit 12 is connected to the fourth capacitor 21. The output terminal 43 is grounded through a ninth resistance 56 having a relatively high resistance value, and is connected to the collector of a fourth switch transistor 47. The fourth switch transistor 47 has an emitter grounded, and a base connected through a tenth resistance 57 to a second band switch input terminal 40.

When the television signal is received, a voltage of 0V is applied from the band decoder 13 to the second band switch input terminal 40, and the fourth switch transistor 47 is turned off. Since the ninth resistance 56 has a high resistance value, the output terminal 43 is brought into the released state. For this reason, a reverse voltage is applied to the second varactor diode 30, so that the sixth capacitor 23, the second varactor diode 30, the third inductance element 26, and the third capacitor 20 construct a series tuned circuit 16. The tuning frequency of the series tuned circuit 16 is 50 MHz which is 3 MHz higher than the intermediate-frequency band (41 MHz to 47 MHz) and is outside the frequency. The television signal is not tuned, and the signal level can be controlled to be low.

When the FM broadcast signal is received, a voltage of 5V is applied from the band decoder 13 to the second band switch input terminal 40. Then, the fourth switch transistor 47 is turned on, and the output terminal 43 is grounded. Since the second varactor diode 30 to which a forward bias voltage is applied is conductive, the inductance value between the amplifier 58 and the output end 60 is higher than when the television signal is received. Since the fourth capacitor 21 is grounded, the capacitance value between the output end 60 and the ground is higher than when the television signal is received. The tuning frequency of the series tuned circuit 16 consisting of the inductance component between the amplifier 58 and the output end 60 and the capacitance component between the output end 60 and the ground is lower than when the television signal is received. The tuning frequency is 41.25 MHz which is the voice intermediate frequency, so that the FM broadcast signal is tuned, and the signal level is increased and is the same as that of the television signal.

The television signal or the FM broadcast signal which has been amplified by the intermediate-frequency amplifier circuit 7 is inputted to the SAW filter 8. The pass band of the SAW filter 8 is in the range of 41 MHz to 47 MHz to pass the signal through the intermediate-frequency band of the television signal. The pass band of the SAW filter 8 is broader than the bandwidth of the FM broadcast signal frequency-converted to the voice intermediate frequency. When the FM broadcast signal is received, the intermediate-frequency tuned circuit 6 tunes the FM broadcast signal to be received. The signal adjacent to the FM broadcast signal to be received is removed by the intermediate-frequency tuned circuit 6.

FIG. 7 shows an embodiment in which a first varactor diode 29 is connected to the second parallel tuned circuit 15 of the intermediate-frequency tuned circuit 6 shown in FIG. 5. This embodiment is similar to the embodiment shown in FIG. 5, except for the first parallel tuned circuit 14, the second parallel tuned circuit 15, and the first varactor diode 29, and the description thereof will be omitted.

When the television signal is received, a voltage of 0 V is applied from the band decoder 13 to the first band switch input terminal 39. A voltage of 10V is applied to the cathode of the first varactor diode 29, and a reverse bias voltage of 5V is applied to the first varactor diode 29, so that the first varactor diode 29 is a capacitor. The first varactor diode 29 and the second parallel tuned circuit 15 construct a series-parallel tuned circuit. The series-parallel tuned circuit is series-tuned at 39.75 MHz corresponding to the image carrier of a higher side television channel adjacent to a television channel to be received. In the intermediate-frequency tuned circuit 6, the series tuning frequency of the series-parallel tuned circuit consisting of the second parallel tuned circuit 15 and the first varactor diode 29 is a series tuning frequency. The first capacitor 18, the second capacitor 19, the first inductance elements 24a, 24b, the second inductance element 25, and the first varactor diode 29 are selected, so that the parallel tuning frequency of the intermediate-frequency tuned circuit 6 is 44 MHz which is the intermediate-frequency band.

When the FM broadcast signal is received, a voltage of 5V is applied from the band decoder 13 to the first band switch input terminal 39. Then, a voltage of 0V is applied to the cathode of the first varactor diode 29, and a forward bias voltage is applied to the first varactor diode 29. Thus, the first varactor diode 29 is conductive. The intermediate-frequency tuned circuit 6 is parallel-tuned by a parallel circuit consisting of the first parallel tuned circuit 14 and the second parallel tuned circuit 15. The first capacitor 18, the second capacitor 19, the first inductance elements 24a, 24b, and the second inductance element 25 are selected, so that the parallel-tuning frequency is 41.25 MHz which is the voice intermediate frequency.

As described above, the intermediate-frequency tuned circuit of the television tuner of the present invention has a first parallel tuned circuit, a second parallel tuned circuit, and switch means connected in series with the second parallel tuned circuit, wherein when a television signal is received, the switch means is turned off to tune the signal of the intermediate-frequency band of the television signal by the first parallel tuned circuit, and when an FM broadcast signal is received, the switch means is turned on, and the first parallel tuned circuit and the second parallel tuned circuit tune the voice intermediate frequency. One intermediate-frequency tuned circuit can tune the television signal and the FM broadcast signal at a frequency and in a band to be desired. The television tuner can be inexpensive and be made smaller.

The intermediate-frequency tuned circuit of the television tuner of the present invention has a first parallel tuned circuit, a second parallel tuned circuit, and a first varactor diode connected in series with the second parallel tuned circuit, wherein when a television signal is received, a reverse bias voltage is applied to the first varactor diode and the intermediate-frequency tuned circuit is series-parallel tuned, so that the intermediate-frequency tuned circuit is series-tuned to the frequency of the intermediate-frequency band corresponding to the image carrier of a higher side television channel adjacent to a television channel to be received and is parallel-tuned to the intermediate-frequency band. When an FM broadcast signal is received, a forward bias voltage is applied to the first varactor diode. When the FM broadcast signal is received, the first varactor diode is brought into a conductive state, so that the intermediate-frequency tuned circuit is parallel-tuned to the voice intermediate frequency. One intermediate-frequency tuned circuit can tune the television signal and the FM broadcast signal at a frequency and in a band to be desired, and the television tuner can be made smaller. In particular, since the signal of the upper side adjacent channel can be removed, there is an effect of removing an interference wave.

The series tuned circuit connected between the output end and the ground of the intermediate-frequency amplifier of the television tuner of the present invention can change the tuning frequency. When a television signal is received, the tuning frequency of the series tuned circuit is outside the intermediate-frequency band. When an FM broadcast signal is received, the tuning frequency of the series tuned circuit is outside the intermediate-frequency band. When the FM broadcast signal is received, the tuning frequency of the series tuned circuit is tuned to the voice intermediate frequency. The gain of the FM broadcast signal is larger than the gain of the television signal. The television signal and the FM broadcast signal have the same level.

The first parallel tuned circuit of the television tuner of the present invention has a first inductance element and a first capacitor connected in parallel with each other. The second parallel tuned circuit has a second inductance element and a second capacitor connected in parallel with each other. The series tuned circuit has a second varactor diode, a third inductance element, and a third capacitor connected in series with each other, and a fourth capacitor connected in parallel with the third capacitor through a second switch means. The television tuner can be made inexpensive.

The intermediate-frequency tuned circuit of the television tuner of the present invention is provided with a trap circuit. When a television signal is received, the trap circuit attenuates the signal of the frequency of the intermediate-frequency band corresponding to the voice carrier of a lower side television channel adjacent to a television channel to be received. When an FM broadcast signal is received, the trap frequency is the frequency between the image carrier and the voice carrier of the intermediate-frequency band. One trap circuit can remove an interference wave of the television signal and the FM broadcast signal. The television tuner can be made smaller.

What is claimed is:

1. A television tuner comprising:

a mixer to be fed on of a television signal and an FM broadcast signal to frequency-convert the television signal to an intermediate-frequency band of a television, and frequency-convert he FM broadcast signal to a voice intermediate frequency in the intermediate-frequency band; and an intermediate-frequency tuned circuit provided at a later stage than the mixer, wherein the intermediate-frequency tuned circuit comprises a first parallel tuned circuit tuned to a frequency substantially in a center of the intermediate-frequency band, a second parallel tuned circuit tuned to a frequency lower than the voice intermediate frequency, and a switch connected in series with the second parallel tuned circuit, a signal of the intermediate-frequency band and a signal of the voice intermediate-frequency band are applied to both ends of the first parallel tuned circuit and both ends of a series circuit comprising the second parallel tuned circuit and the switch, when the television signal is received, the switch is brought into an off state, when the FM broadcast signal is received, the switch is brought into an on state, so that a parallel circuit comprising the first tuned circuit and the second tuned circuit is tuned to the voice intermediate frequency.

2. A television tuner comprising:

a mixer to be fed one of a television signal and an FM broadcast signal to frequency-convert the television signal to an intermediate-frequency band of a television, and frequency-convert the FM broadcast signal to a voice intermediate frequency in the intermediate-frequency band; and an intermediate-frequency tuned circuit provided at a later stage than the mixer, wherein the intermediate-frequency tuned circuit comprises a first parallel tuned circuit, a second parallel tuned circuit, and a first varactor diode connected in series with the second parallel tuned circuit, a parallel tuning frequency of either of the first parallel tuned circuit and the second parallel tuned circuit is set to be higher than a frequency in a center of the intermediate-frequency band, and a parallel tuning frequency of the other tuned circuit is set to be lower than the voice intermediate frequency, the signal of the intermediate-frequency band and the signal of the voice intermediate-frequency band are applied to both ends of the first parallel tuned circuit and both ends of a series circuit comprising the second parallel tuned circuit and the first varactor diode, when the television signal is received, a reverse bias voltage is applied to the first varactor diode, so that the second parallel tuned circuit and the first varactor diode are series-tuned to the frequency of the intermediate-frequency band corresponding to an image carrier of a higher side television channel adjacent to a television channel to be received, and a parallel circuit of the second parallel tuned circuit and the first varactor diode connected in series, and the first parallel tuned circuit is tuned to the intermediate-frequency band, when the FM broadcast signal is received, the first varactor diode is brought into a conductive state, so that a parallel circuit comprising the first parallel tuned circuit and the second parallel tuned circuit is tuned to the voice intermediate-frequency.

3. The television tuner according to claim 1, further comprising an intermediate-frequency amplifier provided at a later stage than the mixer, and a series tuned circuit connected between an output end and the ground of the intermediate-frequency amplifier, wherein the series tuned circuit has a midpoint as an output end, a tuning frequency of the series tuned circuit is changeable, when the television signal is received, the tuning frequency of the series tuned circuit is outside the intermediate-frequency band, when the FM broadcast signal is received, the tuning frequency of the series tuned circuit is tuned to the voice intermediate frequency.

4. The television tuner according to claim 2, further comprising an intermediate-frequency amplifier provided at a later stage than the mixer, and a series tuned circuit connected between an output end and the ground of the intermediate-frequency amplifier, wherein the series tuned circuit has a midpoint as an output end, a tuning frequency of the series tuned circuit is changeable, when the television signal is received, the tuning frequency of the series tuned circuit is outside the intermediate-frequency band, when the FM broadcast signal is received, the tuning frequency of the series tuned circuit is tuned to the voice intermediate frequency.

5. The television tuner according to claim 3, wherein the first parallel tuned circuit has a first inductance element and a first capacitor connected in parallel with each other, the second parallel tuned circuit has a second inductance element and a second capacitor connected in parallel with each other, the series tuned circuit has a second varactor diode, a third inductance element, and a third capacitor connected in series with each other, and a fourth capacitor connected in parallel with the third capacitor through a second switch, when the television signal is received, a reverse bias voltage is applied to the first varactor diode and the second varactor diode, and the second switch is brought into an off state, when the FM broadcast signal is received, a forward bias is applied to the first varactor diode and the second varactor diode, and the second switch is brought into an on state.

6. The television tuner according to claim 4, wherein the first parallel tuned circuit has a first inductance element and a first capacitor connected in parallel with each other, the second parallel tuned circuit has a second inductance element and a second capacitor connected in parallel with each other, the series tuned circuit has a second varactor diode, a third inductance element, and a third capacitor connected in series with each other, and a fourth capacitor connected in parallel with the third capacitor through a second switch, when the television signal is received, a reverse bias voltage is applied to the first varactor diode and the second varactor diode, and the second switch is brought into an off state, when the FM broadcast signal is received, a forward bias is applied to the first varactor diode and the second varactor diode, and the second switch is brought into an on state.

7. The television tuner according to claim 1, wherein the intermediate-frequency tuned circuit is provided with a trap circuit, the trap circuit has an inductance element and a varactor diode connected in parallel with each other, when the television signal is received, a reverse bias voltage is applied to the varactor diode, so that the trap circuit attenuates a signal of the frequency of the intermediate-frequency band corresponding to a voice carrier of a lower side television channel adjacent to a television channel to be received, when the FM broadcast signal is received, the reverse bias voltage applied to the varactor diode is lowered than when the television signal is received, and a trap frequency is a frequency between the image carrier and the voice carrier of the intermediate-frequency band.

8. The television tuner according to claim 2, wherein the intermediate-frequency tuned circuit is provided with a trap circuit, the trap circuit has an inductance element and a second varactor diode connected in parallel with each other, when the television signal is received, a reverse bias voltage is applied to the second varactor diode, so that the trap circuit attenuates a signal of the frequency of the intermediate-frequency band corresponding to a voice carrier of a lower side television channel adjacent to a television channel to be received, when the FM broadcast signal is received, the reverse bias voltage applied to the second varactor diode is lowered than when the television signal is received, and a trap frequency is a frequency between the image carrier and the voice carrier of the intermediate-frequency band.

9. The television tuner according to claim 3, wherein the intermediate-frequency tuned circuit is provided with a trap circuit, the trap circuit has an inductance element and a second varactor diode connected in parallel with each other, when the television signal is received, a reverse bias voltage is applied to the second varactor diode, so that the trap circuit attenuatesa signal of the frequency of the intermediate-frequency band corresponding to the voice carrier of a lower side television channel adjacent to a television channel to be received, when the FM broadcast signal is received, the reverse bias voltage applied to the second varactor diode is lowered than when the television signal is received, and the trap frequency is a frequency between the image carrier and the voice carrier of the intermediate-frequency band.

10. The television tuner according to claim 4, wherein the intermediate-frequency tuned circuit is provided with a trap circuit, the trap circuit has an inductance element and a second varactor diode connected in parallel with each other, when the television signal is received, a reverse bias voltage is applied to the second varactor diode, so that the trap circuit attenuates a signal of the frequency of the intermediate-frequency band corresponding to a voice carrier of a lower side television channel adjacent to a television channel to be received, when the FM broadcast signal is received, the reverse bias voltage applied to the second varactor diode is lowered than when the television signal is received, and a trap frequency is a frequency between the image carrier and the voice carrier of the intermediate-frequency band.

11. The television tuner according to claim 5, wherein the intermediate-frequency tuned circuit is provided with a trap circuit, the trap circuit has a fourth inductance element and a third varactor diode connected in parallel with each other, when the television signal is received, a reverse bias voltage is applied to the third varactor diode, so that the trap circuit attenuates a signal of the frequency of the intermediate-frequency band corresponding to a voice carrier of a lower side television channel adjacent to a television channel to be received, when the FM broadcast signal is received, the reverse bias voltage applied to the third varactor diode is lowered than when the television signal is received, and a trap frequency is a frequency between the image carrier and the voice carrier of the intermediate-frequency band.

12. The television tuner according to claim 6, wherein the intermediate-frequency tuned circuit is provided with a trap circuit, the trap circuit has a fourth inductance element and a third varactor diode connected in parallel with each other, when the television signal is received, a reverse bias voltage is applied to the third varactor diode, so that the trap circuit attenuates a signal of the frequency of the intermediate-frequency band corresponding to a voice carrier of a lower side television channel adjacent to a television channel to be received, when the FM broadcast signal is received, the reverse bias voltage applied to the third varactor diode is lowered than when the television signal is received, and a trap frequency is a frequency between the image carrier and the voice carrier of the intermediate-frequency band.

* * * * *

UNITED STATES PATENT AND TRADEMARK OFFICE
CERTIFICATE OF CORRECTION

PATENT NO. : 6,795,128 B2
DATED : September 21, 2004
INVENTOR(S) : Masaki Yamamoto It is certified that error appears in the above-identified patent and that said Letters Patent is hereby corrected as shown below:

Column 10,
Line 32, after "be fed" delete "on" and substitute -- one --.
Line 36, after "frequency-convert" delete "he" and substitute -- the --.
Line 38, delete "attenuatesa" and substitute -- attenuates a --.

Signed and Sealed this

Twenty-seventh Day of December, 2005

JON W. DUDAS
*Director of the United States Patent and Trademark Office*